(12) United States Patent
Ejima et al.

(10) Patent No.: US 12,308,629 B2
(45) Date of Patent: May 20, 2025

(54) ELECTRICAL JUNCTION BOX

(71) Applicant: Sumitomo Wiring Systems, Ltd., Yokkaichi (JP)

(72) Inventors: Takumi Ejima, Yokkaichi (JP); Maiko Isshiki, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 18/547,184

(22) PCT Filed: Feb. 18, 2022

(86) PCT No.: PCT/JP2022/006527
§ 371 (c)(1),
(2) Date: Aug. 21, 2023

(87) PCT Pub. No.: WO2022/181461
PCT Pub. Date: Sep. 1, 2022

(65) Prior Publication Data
US 2024/0322537 A1   Sep. 26, 2024

(30) Foreign Application Priority Data

Feb. 26, 2021 (JP) ................. 2021-030255

(51) Int. Cl.
*B60R 16/023* (2006.01)
*H02G 3/08* (2006.01)

(52) U.S. Cl.
CPC ......... *H02G 3/081* (2013.01); *B60R 16/0238* (2013.01)

(58) Field of Classification Search
CPC ................................................ B60R 16/0239
See application file for complete search history.

(56) References Cited

U.S. PATENT DOCUMENTS

| 9,979,170 | B1* | 5/2018 | Nakano | ................ H01B 7/0045 |
| 2021/0050563 | A1 | 2/2021 | Fernandez-Galindo et al. | |
| 2023/0142638 | A1* | 5/2023 | Mori | ...................... H02G 3/081 174/50 |

FOREIGN PATENT DOCUMENTS

| JP | 2012-191711 A | 10/2012 |
| JP | 2012-205329 A | 10/2012 |
| JP | 2020-181908 A | 11/2020 |
| JP | 2021-197772 A | 12/2021 |

OTHER PUBLICATIONS

International Search Report, Application No. PCT/JP2022/006527, mailed Apr. 19, 2022. ISA/Japan Patent Office.

* cited by examiner

*Primary Examiner* — Hung V Ngo
(74) *Attorney, Agent, or Firm* — Honigman LLP

(57) ABSTRACT

An electrical junction box for vehicles that includes: a busbar one surface of which is placed into contact with a terminal exposed from a through-hole in a housing; and a cover that covers the terminal and the busbar from the other surface-side of the busbar, wherein the cover is rotatably provided on one wall of the housing, and the electrical junction box includes an open-state maintaining portion that maintains the cover in an open state.

7 Claims, 12 Drawing Sheets

ELECTRICAL JUNCTION BOX

CROSS-REFERENCE TO RELATED APPLICATIONS

This application is the U.S. national stage of PCT/JP2022/006527 filed on Feb. 18, 2022, which claims priority of Japanese Patent Application No. JP 2021-030255 filed on Feb. 26, 2021, the contents of which are incorporated herein.

TECHNICAL FIELD

The present disclosure relates to an electrical junction box for vehicles that includes a busbar.

BACKGROUND

Conventionally, electrical junction boxes including a circuit in which a busbar is used in order to allow a relatively large current to flow are installed in vehicles. Furthermore, in recent years, currents flowing through busbars have also been increasing commensurately with expansion of vehicle functionality.

JP 2020-181908A discloses an electrical junction box in which: a housing including a lid that can be opened and closed is included; a busbar can be attached to the inside of the housing by opening the lid; and the lid can be placed in a closed state after the busbar is attached.

Many electrical junction boxes have a terminal that is exposed to the outside via a through-hole passing through a housing, and a busbar can be connected to the terminal from outside the housing. Furthermore, a cover that covers the terminal is provided in order to suppress the occurrence of problems caused by the terminal being exposed.

On the other hand, when assembly work for connecting a busbar to the terminal is to be carried out and the cover is currently closed, a worker needs to carry out a troublesome operation of opening the cover prior to the assembly work.

Furthermore, a worker inspecting the state of connection between the terminal and the busbar, etc., opens the cover to carry out the inspection work; however, if the worker forgets to close the cover after the inspection work, electric shock, electric leakage, short-circuiting, etc., may occur because the terminal would remain exposed to the outside.

However, in the electric device according to JP 2020-181908A, no consideration is made of a case in which a terminal is exposed through a through-hole in a housing; that is, the above-described problems are not considered and cannot be solved.

In view of this, one aim is to provide an electrical junction box that can enhance the workability of assembly work and can prevent a cover from being left open.

SUMMARY

An electrical junction box according to an embodiment of the present disclosure is an electrical junction box for vehicles that includes: a busbar one surface of which is placed into contact with a terminal exposed from a through-hole in a housing; and a cover that covers the terminal and the busbar from the other surface-side of the busbar, wherein the cover is rotatably provided on one wall of the housing, and the electrical junction box includes an open-state maintaining portion that maintains the cover in an open state.

Advantageous Effects

According to the present disclosure, an electrical junction box that can enhance the workability of assembly work and can prevent a cover from being left open can be provided.

DETAILED DESCRIPTION OF PREFERRED EMBODIMENTS

Figure 1:
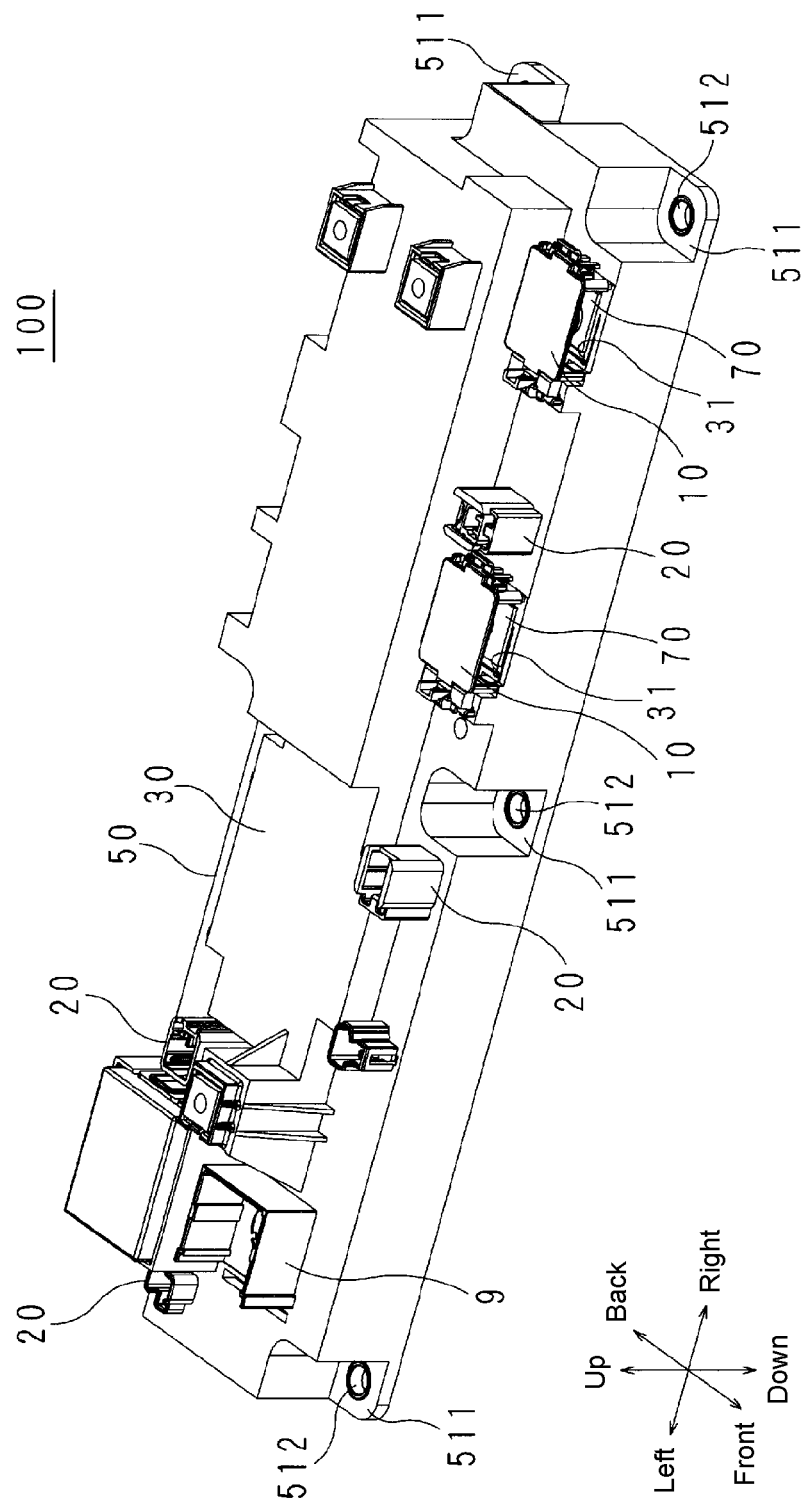
FIG. 1 is a perspective view of an electrical junction box according to Embodiment 1.

First, modes for carrying out the present disclosure will be listed and described. Furthermore, the modes described below may at least be partially combined as appropriate.

An electrical junction box according to an embodiment of the present disclosure is an electrical junction box for vehicles that includes: a busbar one surface of which is placed into contact with a terminal exposed from a through-hole in a housing; and a cover that covers the terminal and the busbar from the other surface-side of the busbar, wherein the cover is rotatably provided on one wall of the housing, and the electrical junction box includes an open-state maintaining portion that maintains the cover in an open state.

Because the open-state maintaining portion, which maintains the cover in the open state, is included in the present embodiment, the cover is maintained in the open state by the open-state maintaining portion once a worker rotates the cover into the open state, for example.

The electrical junction box according to an embodiment of the present disclosure includes an engagement portion that is provided in the cover and that includes a recess portion that engages with the open-state maintaining portion when the cover is in the open state.

In the present embodiment, the open-state maintaining portion engages with the recess portion when the cover is in the open state. Accordingly, the cover is maintained in the open state.

The electrical junction box according to an embodiment of the present disclosure includes a swinging piece that can swing in a thickness direction of the one wall, and the swinging piece includes the open-state maintaining portion in an end portion thereof, and includes a projection that comes into contact with the busbar.

In the present embodiment, the open-state maintaining portion is provided in an end portion of the swinging piece, and the swinging piece can swing in the thickness direction of the one wall. When the busbar is mounted on the terminal, the swinging piece is pushed because the busbar and the projection come into contact with one another, resulting in the engagement between the recess portion and the open-state maintaining portion being released.

The electrical junction box according to an embodiment of the present disclosure includes a swinging piece that can swing in a thickness direction of the one wall, and a projection that comes into contact with the swinging piece is provided on the busbar.

In the present embodiment, the open-state maintaining portion is provided in an end portion of the swinging piece, and the swinging piece can swing in the thickness direction of the one wall. When the busbar is mounted on the terminal, the swinging piece is pushed because the projection on the busbar comes into contact with the swinging piece, resulting in the engagement between the recess portion and the open-state maintaining portion being released.

In the electrical junction box according to an embodiment of the present disclosure, the cover includes: a circumferential wall portion that has a shape of a square cylinder one wall of which is open; and a lid that opens and closes an opening in one end of the circumferential wall portion.

In the present embodiment, because the cover includes the circumferential wall portion, which has the shape of a square cylinder, and the lid, which opens and closes an opening in one end of the circumferential wall portion, a worker can open and close the lid and check the state of connection between the busbar and the terminal, etc., as necessary.

In the electrical junction box according to an embodiment of the present disclosure, the lid: is rotatably held; and includes a spring portion that restricts the lid from rotating to a predetermined angle or more.

The spring portion, which restricts the lid from rotating to a predetermined angle or more, is included in the present embodiment; thus, when a worker rotates the lid to the predetermined angle or more upon rotating and opening the lid, for example, the spring portion stops the lid from rotating any further, and the resilience of the spring portion biases the lid in a direction in which the lid closes.

In the electrical junction box according to an embodiment of the present disclosure, a depression is formed in the swinging piece at a position corresponding to the projection on the busbar.

In the present embodiment, the projection on the busbar is inserted into the depression when the busbar is correctly mounted on the terminal. That is, the depression guides the positioning of the busbar.

An electrical junction box according to embodiments of the present disclosure will be described in the following with reference to the drawings. Note that the present disclosure is not limited to these examples, and is intended to include all modifications that are indicated by the claims and are within the meaning and scope of equivalents of the claims.

Embodiment 1

FIG. 1 is a perspective view of an electrical junction box 100 according to Embodiment 1. The electrical junction box 100 is a so-called vehicle junction box to which various electronic components are attached.

In the present embodiment, for the sake of convenience, the "front", "back", "left", "right", "top", and "bottom" of the electrical junction box 100 are defined based on the front-back, left-right, and top-bottom directions indicated in the drawings. In the following, description will be provided using the front-back, left-right, and top-bottom directions that are defined as such.

For example, the electrical junction box 100 is attached to the outside of a battery pack of an electric vehicle (EV). The electrical junction box 100 includes a housing 50 to which electric components such as a relay are attached, for example. For example, the housing 50 is made from a resin, a metal, or the like.

The housing 50 has a substantially rectangular shape in a plan view. Flat portions 511 are formed on the housing 50 by cutting out the four corners thereof and the middle portions of the two long sides thereof. That is, the flat portions 511 are formed at six locations of the housing 50, and a through-hole 512 is formed in the center portion of each flat portion 511. For example, the housing 50 (electrical junction box 100) can be attached to a battery pack of an EV by inserting screws into the through-holes 512 in the flat portions 511 and screwing the screws into screw holes in the battery pack. Only four flat portions 511 are illustrated in FIG. 1.

The housing 50 includes a ceiling plate 30 (one wall), on the outer surface of which an attaching portion 9 for attaching an electric component such as a relay is provided at one location, and a plurality of connection portions 20 that are each to be connected to an external fuse, connector, or the like are provided.

Furthermore, through-holes 31 passing through the ceiling plate 30 in the thickness direction are formed at two locations of the ceiling plate 30, and a terminal 70 is exposed through each of the through-holes 31. As described later, a busbar 40 is fixed onto the terminal 70. The terminal 70 is covered by a cover 10. Illustration of the busbar 40 is omitted in FIG. 1.

Figure 2:
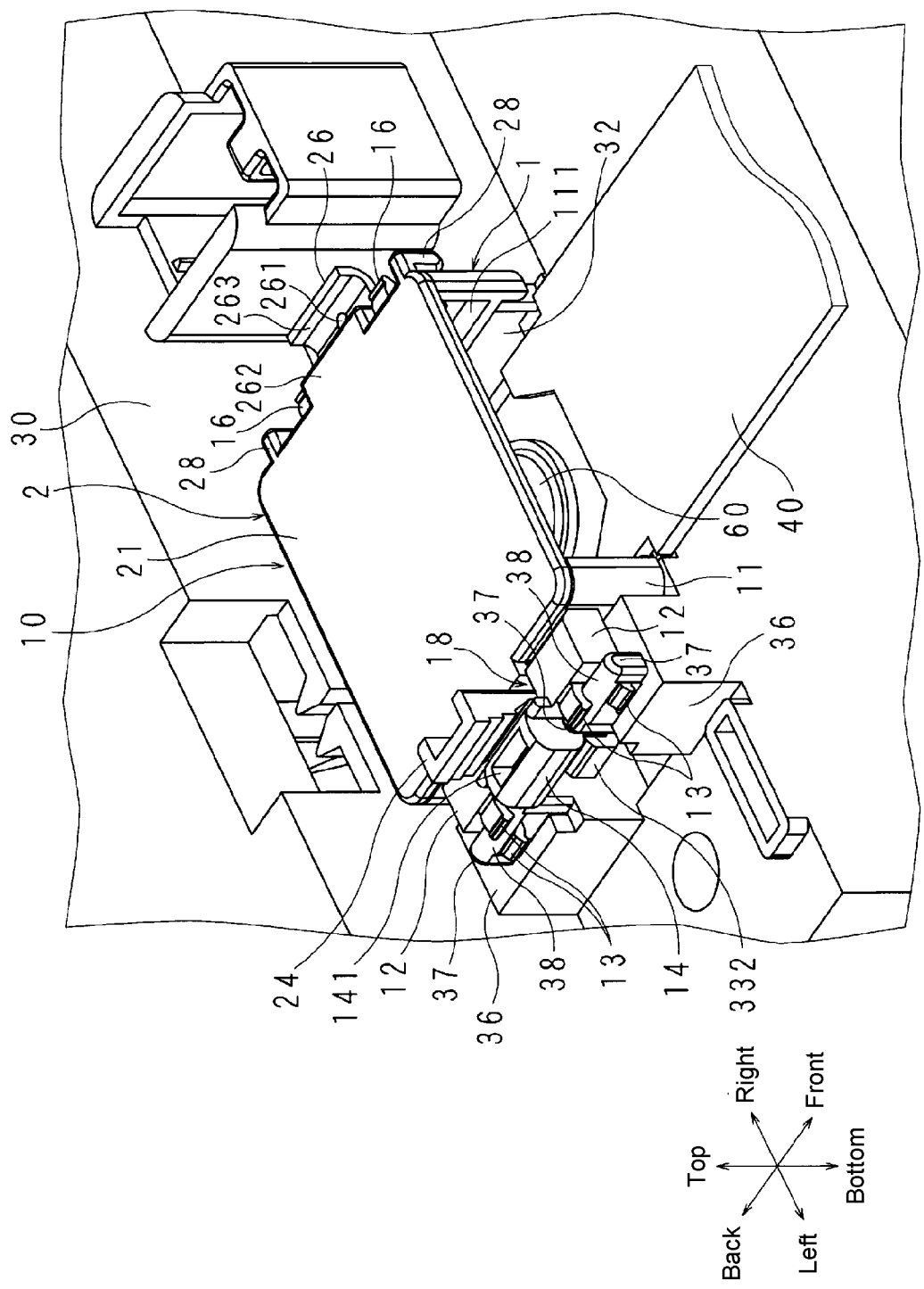
FIG. 2 is a partially enlarged view illustrating a state in which a busbar has been connected to a terminal of the electrical junction box according to Embodiment 1.

FIG. 2 is a partially enlarged view illustrating a state in which a busbar 40 has been connected to a terminal 70 of the electrical junction box 100 according to Embodiment 1.

The terminal 70 is exposed from a rectangular through-hole 31, and one surface of the busbar 40 is in contact with the terminal 70 as a result of the busbar 40 being mounted on the terminal 70. A bolt 60 is screwed into a housing 50-side screw hole 72 (see FIG. 5) through a through-hole (unillustrated) in the busbar 40 and a through-hole 71 (see FIG. 3) in the terminal 70. Thus, the terminal 70 and the busbar 40 are electrically connected.

Furthermore, the cover 10 is made from an insulating material such as a resin, and covers the portion where the busbar 40 and the terminal 70 are connected from the other surface-side of the busbar 40. The cover 10 is rotatably attached to the ceiling plate 30. The cover 10 includes a substantially cylindrical circumferential wall portion 1, and a lid 2 provided on an opening in one end of the circumferential wall portion 1.

Figure 3:
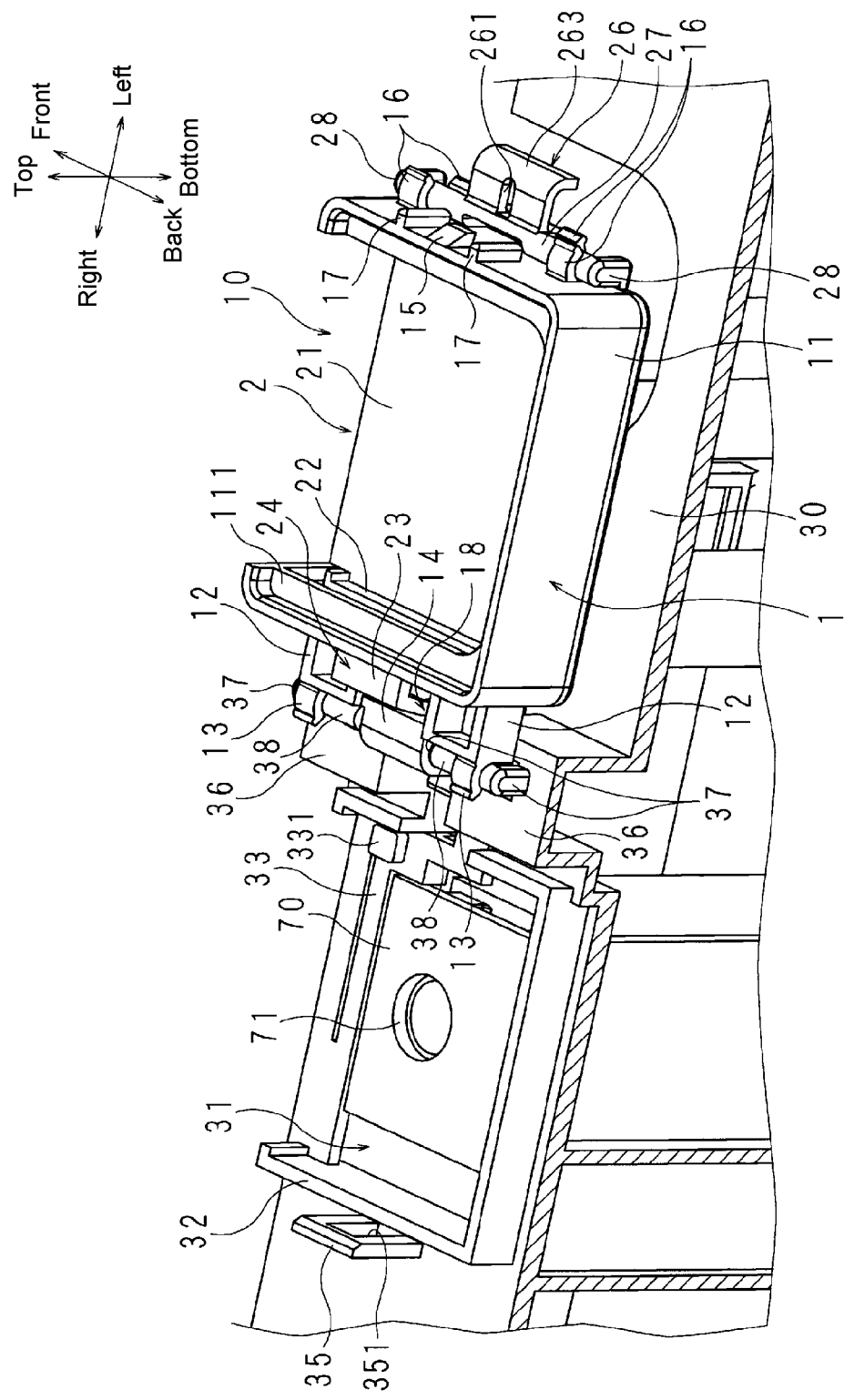
FIG. 3 is a perspective view illustrating a state of the electrical junction box according to Embodiment 1 in which a cover is completely open.
Figure 4:
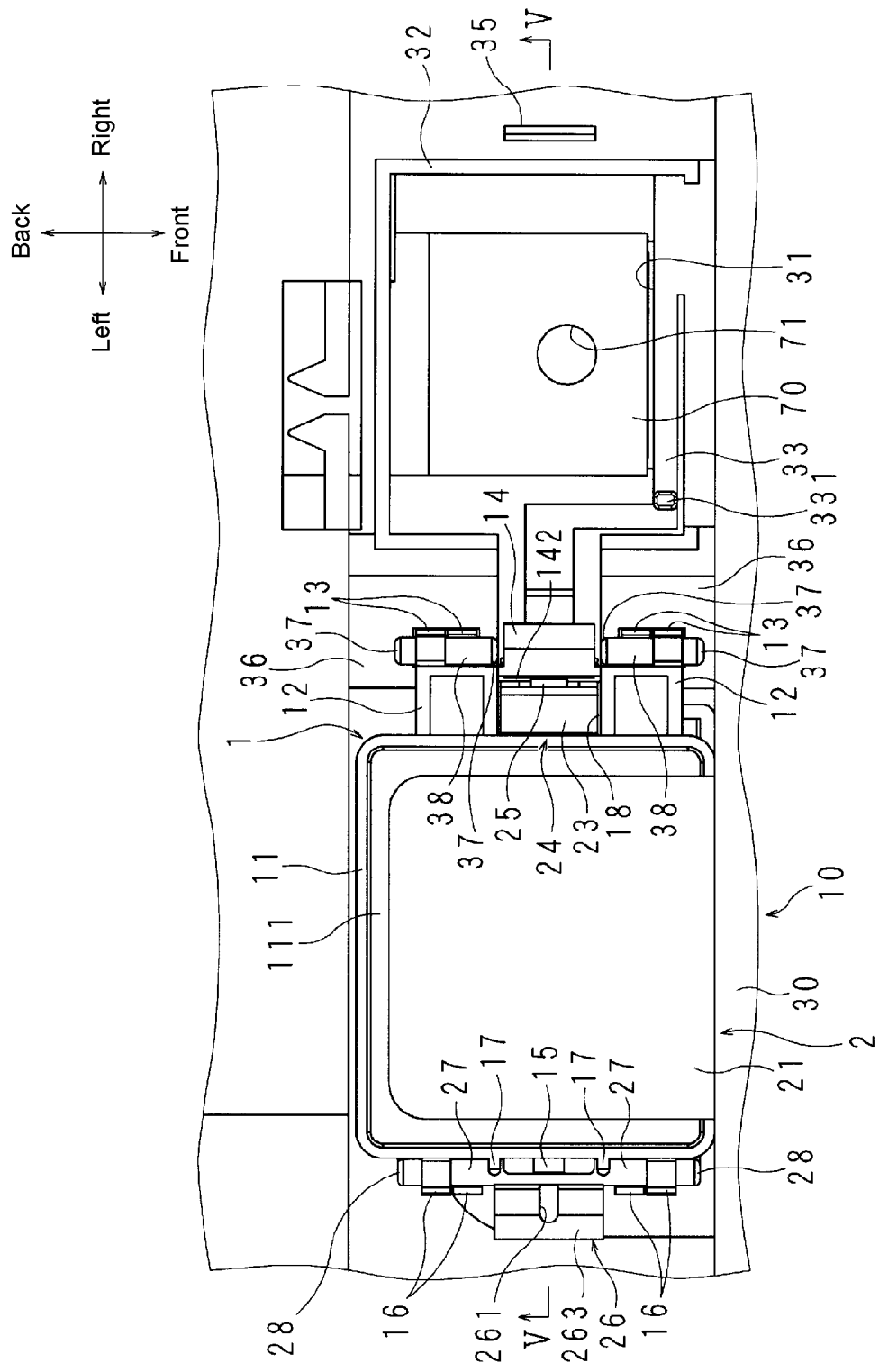
FIG. 4 is a plan view illustrating the state of the electrical junction box according to Embodiment 1 in which the cover is completely open.
Figure 5:
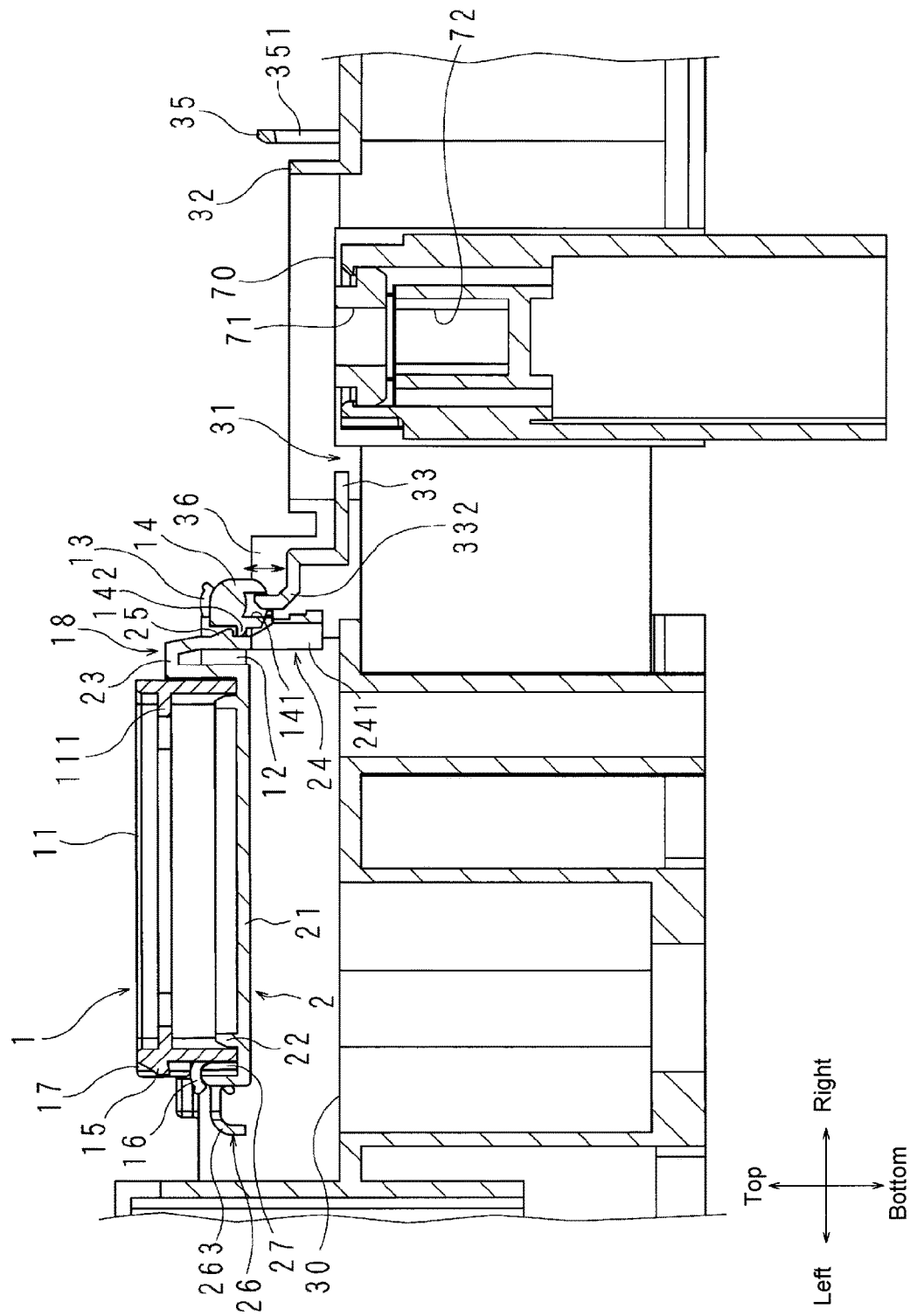
FIG. 5 is a cross-sectional view taken along line V-V in FIG. 4.
Figure 6:
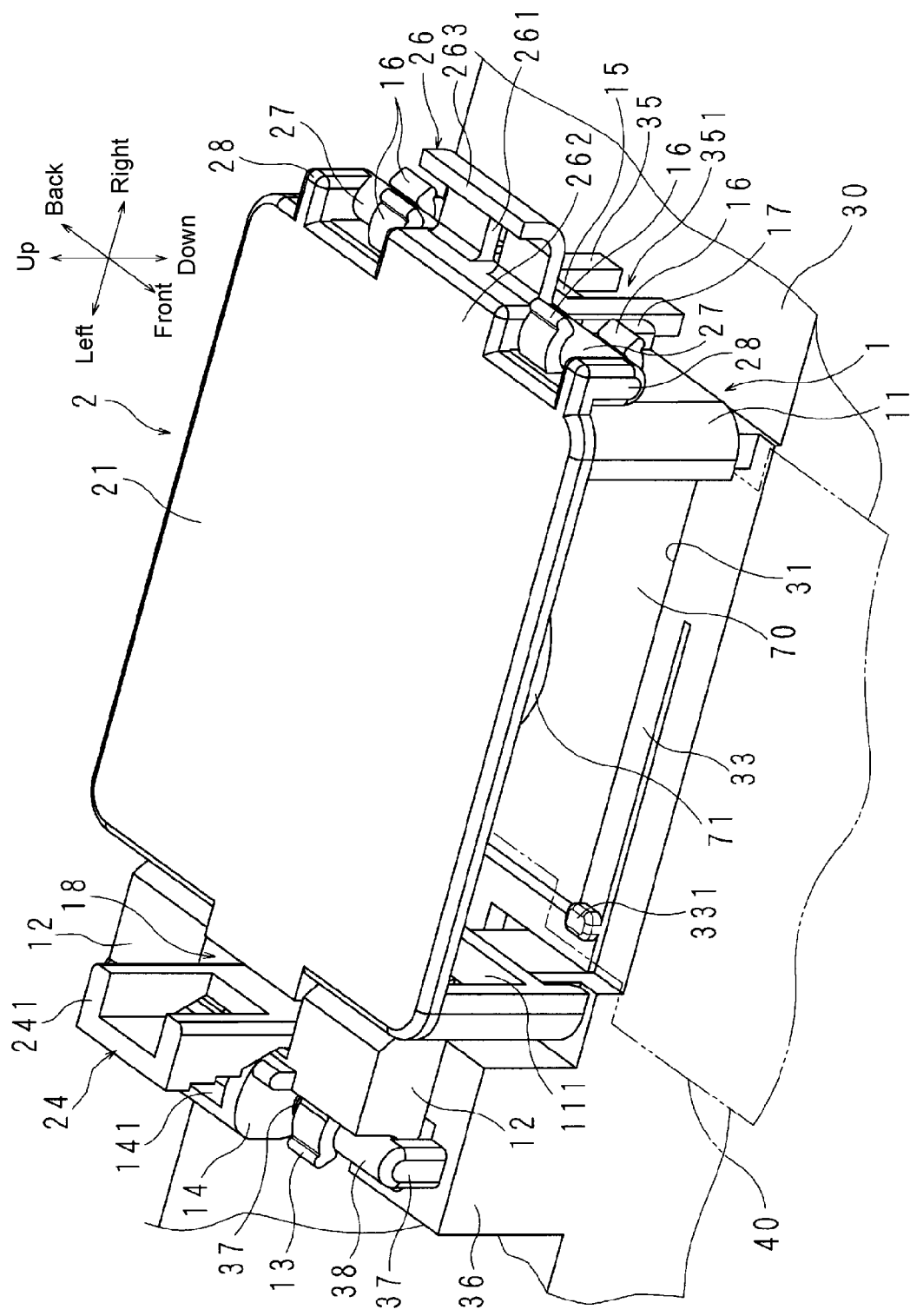
FIG. 6 is a perspective view illustrating a state of the electrical junction box according to Embodiment 1 in which the cover is closed.

FIG. 3 is a perspective view illustrating a state of the electrical junction box 100 according to Embodiment 1 in which the cover 10 is completely open, FIG. 4 is a plan view illustrating the state of the electrical junction box 100 according to Embodiment 1 in which the cover 10 is completely open, FIG. 5 is a cross-sectional view taken along line V-V in FIG. 4, and FIG. 6 is a perspective view illustrating a state of the electrical junction box 100 according to Embodiment 1 in which the cover 10 is closed. In FIGS. 3 to 6, illustration of the busbar 40 is omitted for the sake of convenience. Furthermore, in the following, a state in which the cover 10 is completely open and a state in which the cover 10 is closed will be respectively referred to as an open state and a closed state for the sake of convenience.

The circumferential wall portion 1 includes a square cylinder portion 11 that surrounds the through-hole 31 in the closed state. One wall on the front side of the square cylinder portion 11 is open so that the busbar 40 can be inserted and removed. A rib 111 is provided on the inner surface of the square cylinder portion 11 at a substantially middle portion in the top-bottom direction. The rib 111 is provided so as to project perpendicularly from the inner surface of the square cylinder portion 11.

Two base portions 12 are provided so as to be connected to one side wall among the two side walls of the square cylinder portion 11 that are adjacent to the one wall in a state in which the two base portions 12 are separated from one another in the front-back direction. The base portions 12 are provided at one end portion of the one side wall that is closer to the lid 2, and each have the shape of a box that is open on one side. Two shaft engagement portions 13 that engage with a later-described first rotation shaft 38 are provided so as to project from the distal-end surface of each base portion 12.

Each shaft engagement portion 13 includes a recess portion conforming to the first rotation shaft 38. The two shaft engagement portions 13 are provided so as to be separated from one another in the front-back direction, and so as to be also separated from one another in the top-bottom direction so that the open sides of the recess portions thereof face opposite sides from each other.

A circular cylinder portion 14 (engagement portion) extending in the front-back direction is provided between the two base portions 12 in the front-back direction. A recess portion 141 is formed in the middle portion of the circular cylinder portion 14 in the front-back direction. The recess portion 141 has a rectangular opening. The circular cylinder portion 14 is provided so that the recess portion 141 faces directly upward when the cover 10 is in the closed state.

Furthermore, the circular cylinder portion 14 is provided so as to be separated from the one side wall of the square cylinder portion 11 by a predetermined distance. A space 18 that is surrounded by the circular cylinder portion 14, the two base portions 12, and the one side wall of the square cylinder portion 11 is formed because the base portions 12 are disposed on the front and back sides of the circular cylinder portion 14, and the circular cylinder portion 14 is disposed away from the one side wall of the square cylinder portion 11 as mentioned above. The space 18 is rectangular. Note that the circular cylinder portion 14, the shaft engagement portions 13, the base portions 12, and the square cylinder portion 11 are formed integrally.

Furthermore, the circular cylinder portion 14 is provided with a locking recess portion 142 that is formed by cutting out the circumferential surface thereof and that extends in the front-back direction (see FIGS. 4 and 5). The locking recess portion 142 is open toward the space 18, and locks a later-described locking claw 25.

Furthermore, four shaft supporting portions 16 that support later-described second rotation shafts 27 are provided so as to be connected to the other side wall of the square cylinder portion 11, which opposes the one side wall. The four shaft supporting portions 16 are provided at one end portion of the other side wall that is closer to the lid 2, and are provided in pairs that are separated from one another in the front-back direction. Each shaft supporting portion 16 includes a recess portion conforming to a second rotation shaft 27. The pairs of shaft supporting portions 16 are provided so as to be separated from one another in the front-back direction, and the shaft supporting portions 16 in each pair are separated from one another in the top-bottom direction so that the open sides of the recess portions thereof face opposite sides from each other.

An engaging claw 15 that engages with a later-described engagement receiving portion 35 is provided at the center of the other end portion of the other side wall of the square cylinder portion 11. The engaging claw 15 is triangular in a longitudinal cross-sectional view, and the left-right-direction dimension thereof increases toward the one end portion of the other side wall. Furthermore, two guide ribs 17 that guide the engagement between the engagement receiving portion 35 and the engaging claw 15 are provided so as to project from the other side wall; each guide rib 17 is provided between one pair of shaft supporting portions 16 and the engaging claw 15 in the front-back direction. The guide ribs 17 extend from the other end toward the one end of the other side wall.

Incidentally, two rectangular-parallelepiped-shaped supports 36 are provided so as to project from the ceiling plate 30 near the one side wall of the square cylinder portion 11. The two supports 36 are provided so as to be separated by a distance from one another in the front-back direction. This distance is greater than the front-back-direction dimension of the circular cylinder portion 14.

Two supporting projections 37 that support a first rotation shaft 38 are provided so as to project from the distal-end surface of each support 36. The two supporting projections 37 are provided so as to be separated from one another in the front-back direction, and support the two ends of the first rotation shaft 38. The first rotation shaft 38 has the shape of a substantially round bar that is long in the front-back direction. The first rotation shaft 38 is laid across the pair of supporting projections 37.

That is, a pair of supporting projections 37 are provided on each support 36, and the pair of supporting projections 37 support one first rotation shaft 38. The supporting projections 37 and the first rotation shaft 38 are formed integrally.

The shaft engagement portions 13 of the square cylinder portion 11 engage with the first rotation shafts 38. Specifically, one first rotation shaft 38 is engaged with two shaft engagement portions 13.

As mentioned above, each base portion 12 is provided with two shaft engagement portions 13, and the two shaft engagement portions 13 are provided so as to be separated from one another in the top-bottom direction so that the open sides of the recess portions thereof face opposite sides from each other. A first rotation shaft 38 is interposed between the two shaft engagement portions 13, and is rotatably held between the two shaft engagement portions 13. Accordingly, the cover 10 (square cylinder portion 11) rotates about the first rotation shafts 38, and opens and closes the portion where the terminal 70 and the busbar 40 are connected.

The lid 2 is rotatably provided on the square cylinder portion 11, and the opening in the one end of the circumferential wall portion 1 is opened and closed as a result of the lid 2 rotating. In the following, a state in which the lid 2 is closed and a case in which the lid 2 is not closed will be respectively referred to as a closed state and an open state for the sake of convenience.

The lid 2 includes a rectangular stopper plate 21. The stopper plate 21 has a size that is substantially equal to the size of the opening in the one end of the circumferential wall portion 1. A guide rib 22 is provided so as to project from the inner surface of the stopper plate 21. The guide rib 22 is provided so as to be separated by a distance from the edges of the stopper plate 21, and comes into contact with the inner surface of the square cylinder portion 11 when the lid 2 is in the closed state. That is, the guide rib 22 guides the positioning of the stopper plate 21 when the lid 2 is closed.

A spring portion 26 that restricts the lid 2 (stopper plate 21) from rotating to a predetermined angle or more is provided so as to be connected to one of the four edges of the stopper plate 21 that is near the other side wall of the square cylinder portion 11.

The spring portion 26 includes a rectangular-parallelepiped-shaped base portion 262 that is provided so as to extend from the one edge of the stopper plate 21 and that extends in the front-back direction, and a spring 263 that is provided so as to be connected to the distal-end surface of the base portion 262. The spring 263 rises perpendicularly from the distal-end surface of the base portion 262, and the distal-end portion of the spring 263 is curved toward the stopper plate 21. A through-hole 261 is formed in the center portion of the spring 263.

Furthermore, a holding rib 28 that holds a second rotation shaft 27 is provided so as to be connected to each of the two end portions of the one edge of the stopper plate 21. Each holding rib 28 extends toward the other end portion of the other side wall of the square cylinder portion 11.

Second rotation shafts 27 are provided between the base portion 262 of the spring portion 26 and the holding ribs 28. Each second rotation shaft 27 has the shape of a substantially round bar that is long in the front-back direction, and is provided so as to be separated by a predetermined distance from the other side wall of the square cylinder portion 11. The two ends of each second rotation shaft 27 are held by a holding rib 28 and the base portion 262. The stopper plate 21, the holding ribs 28, the second rotation shafts 27, and the spring portion 26 may be formed integrally.

The second rotation shafts 27 are rotatably held by the shaft supporting portions 16 of the square cylinder portion 11. Specifically, one second rotation shaft 27 is held by two shaft supporting portions 16.

As mentioned above, the shaft supporting portions 16 are provided in pairs that are separated from one another in the front-back direction, and the shaft supporting portions 16 forming a pair are provided so as to be separated from one another in the top-bottom direction so that the open sides of the recess portions thereof face opposite sides from each other. Each second rotation shaft 27 is interposed between two shaft supporting portions 16, and is rotatably held between the two shaft supporting portions 16. Accordingly, the lid 2 (stopper plate 21) rotates about the second rotation shafts 27, and opens and closes the opening in the one end of the circumferential wall portion 1.

Furthermore, a fitting spring 24 is provided on the other edge of the stopper plate 21 that opposes the one edge. The fitting spring 24 includes a fitting portion 23 that is provided so as to be connected to the middle of the other edge of the stopper plate 21. The fitting portion 23 has the shape of a bent plate, and is U-shaped in a longitudinal cross-sectional view. A grip 241 is provided so as to be connected to an end portion of an outer opposing portion that is farther from the stopper plate 21 among the two opposing portions of the fitting portion 23. The grip 241 is C-shaped in a cross-sectional view.

A locking claw 25 that is to be locked to the locking recess portion 142 of the circular cylinder portion 14 is provided so as to project from the center portion of the outer surface of the outer opposing portion of the fitting portion 23. The locking claw 25 is triangular in a longitudinal cross-sectional view, and the left-right-direction dimension thereof increases toward the grip 241.

When the lid 2 rotates and switches to the closed state, the fitting spring 24 is pushed into the space 18 of the square cylinder portion 11. In this process, the outer opposing portion of the fitting spring 24 faces the circular cylinder portion 14. While the fitting spring 24 is being pushed into the space 18, a counterforce in the direction opposite to the bend direction acts on the fitting spring 24. Accordingly, once the fitting spring 24 is pushed into the space 18 until the locking claw 25 reaches the position of the locking recess portion 142, the locking claw 25 is locked to the locking recess portion 142. Thus, the lid 2 switches to the closed state.

Figure 7:
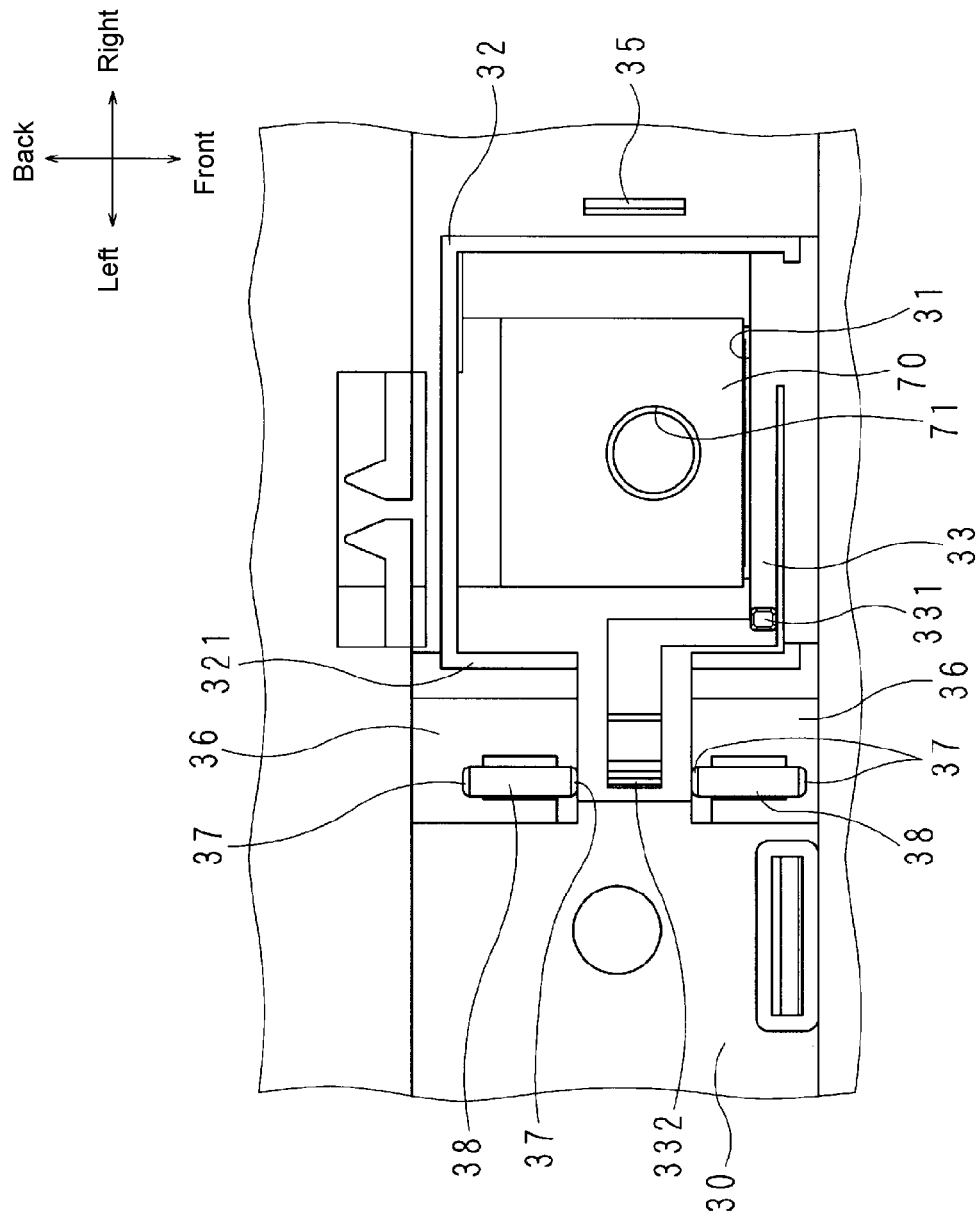
FIG. 7 is a plan view illustrating a state in which the cover has been omitted from FIG. 4.

FIG. 7 is a plan view illustrating a state in which the cover 10 has been omitted from FIG. 4.

A guide frame 32 is provided so as to project from the ceiling plate 30 so that the guide frame 32 surrounds the edge of the through-hole 31. Similarly to the square cylinder portion 11, the guide frame 32 has the shape of a square cylinder of which one wall on the front side is open. When the cover 10 is switched to the closed state, the guide frame 32 comes into contact with the inner surface of the square cylinder portion 11 and guides the cover 10. Furthermore, so that the guide frame 32 does not interfere with the swinging of a later-described swinging piece 33, the center portion of a left side wall 321 that comes into contact with the inside of the one side wall of the square cylinder portion 11 is cut out.

A swinging piece 33 that can swing in the thickness direction of the ceiling plate 30 is formed in edge portions of the through-hole 31. The swinging piece 33 is formed in an edge portion (hereinafter "open-portion-side edge portion") of the through-hole 31 that is near the open portion of the guide frame 32 and an edge portion (hereinafter "left-side-wall-side edge portion") of the through-hole 31 that is near the left side wall 321.

Specifically, the swinging piece 33 has the shape of a crank that extends along the edge of the through-hole 31 from the center portion of the open-portion-side edge portion to the center portion of the left-side-wall-side edge portion, and then extends from the center portion of the left-side-wall-side edge portion through the cutout portion of the left side wall 321. The crank-shaped portion is formed by cutting portions other than the center portion of the open-portion-side edge portion. That is, in the swinging piece 33, only the base portion at the center portion-side of the open-portion-side edge portion is connected to the ceiling plate 30. Accordingly, the swinging piece 33 can swing in the thickness direction of the ceiling plate 30, and the swinging width increases toward the distal-end portion thereof (see the arrow in FIG. 5).

A contact projection 331 is provided so as to project from a bent portion of the swinging piece 33 that is near a corner of the through-hole 31. The contact projection 331 is provided at a position that comes into contact with the one surface of the busbar 40 when the busbar 40 is mounted on the terminal 70.

Furthermore, an open-state maintaining portion 332 that maintains the cover 10 in the open state is provided so as to be connected to the distal-end portion of the swinging piece 33. The open-state maintaining portion 332 has the shape of a hook in a longitudinal cross-sectional view, and the distal-end portion thereof extends perpendicularly to the ceiling plate 30 (see FIG. 5). The open-state maintaining portion 332 is disposed directly below the circular cylinder portion 14 in the top-bottom direction, and the distal end of the open-state maintaining portion 332 is in elastic contact with the circumferential surface of the circular cylinder portion 14. That is, the open-state maintaining portion 332 is biased toward the circular cylinder portion 14.

As mentioned above, the circular cylinder portion 14 is provided so that the recess portion 141 faces directly upward when the cover 10 is in the closed state. In other words, the recess portion 141 faces directly downward when the cover 10 is in the open state. Furthermore, as mentioned above, the open-state maintaining portion 332 is biased toward the circular cylinder portion 14.

Accordingly, when the cover 10 is in the open state, the open-state maintaining portion 332 engages with the recess portion 141 as a result of the distal-end portion of the open-state maintaining portion 332 being inserted into the recess portion 141 (see FIG. 5). When the open-state maintaining portion 332 is engaged with the recess portion 141 in such a manner, the open state of the cover 10 is maintained because the rotation of the cover 10 is restricted.

On the other hand, as mentioned above, the contact projection 331 is provided so as to project from a position of the swinging piece 33 that comes into contact with the one surface of the busbar 40 when the busbar 40 is mounted on the terminal 70. Accordingly, the contact projection 331 is pushed by the busbar 40 when the busbar 40 is mounted on the terminal 70 and screwed to the housing 50 as mentioned above. Because the swinging piece 33 can swing in the thickness direction of the ceiling plate 30 as mentioned above, the swinging piece 33 moves downward, or that is, moves down to the inside of the housing 50, when the contact projection 331 is pushed by the busbar 40. Because the open-state maintaining portion 332 at the distal-end portion of the swinging piece 33 also moves downward when the swinging piece 33 moves downward in such a manner, the engagement between the open-state maintaining portion 332 and the recess portion 141 is released. Thus, the cover 10 becomes capable of rotating.

Incidentally, as illustrated in FIG. 6, an engagement receiving portion 35 is provided so as to project from the ceiling plate 30 near the other side wall of the square cylinder portion 11 when the cover 10 is in the closed state. Furthermore, the engagement receiving portion 35 is provided so as to project at a position corresponding to the engaging claw 15. The engagement receiving portion 35 is substantially inverse U-shaped. At the center portion thereof, the engagement receiving portion 35 has a through-hole 351 passing therethrough in the left-right direction.

When the cover 10 is in the closed state, the engaging claw 15 is fitted into the through-hole 351 in the engagement receiving portion 35 as mentioned above. Thus, the engagement receiving portion 35 engages with the engaging claw 15, and the cover 10 can be maintained in the closed state.

Figure 8:
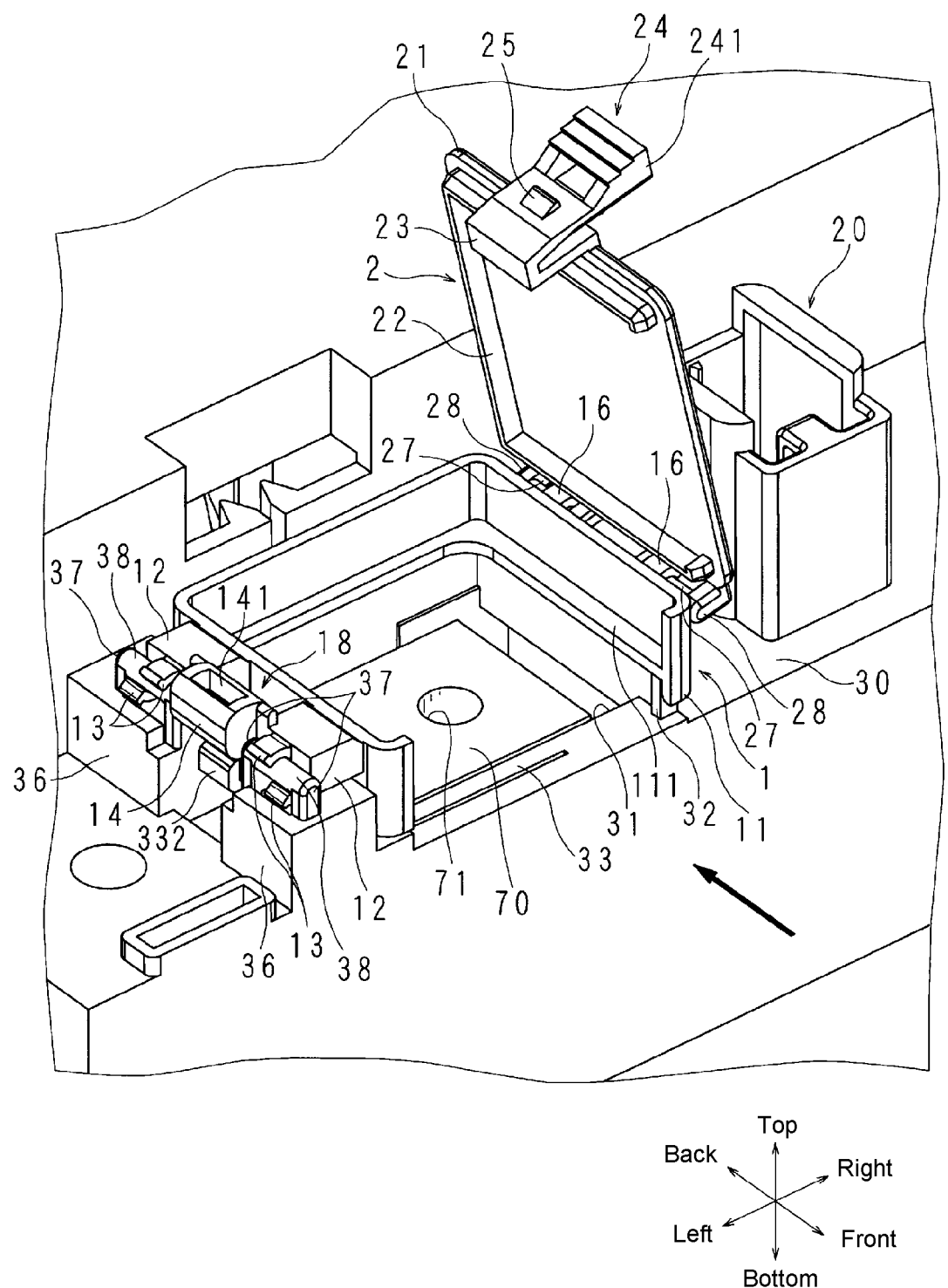
FIG. 8 is a perspective view illustrating a case in which a lid is in an open state in the electrical junction box according to Embodiment 1.
Figure 9:
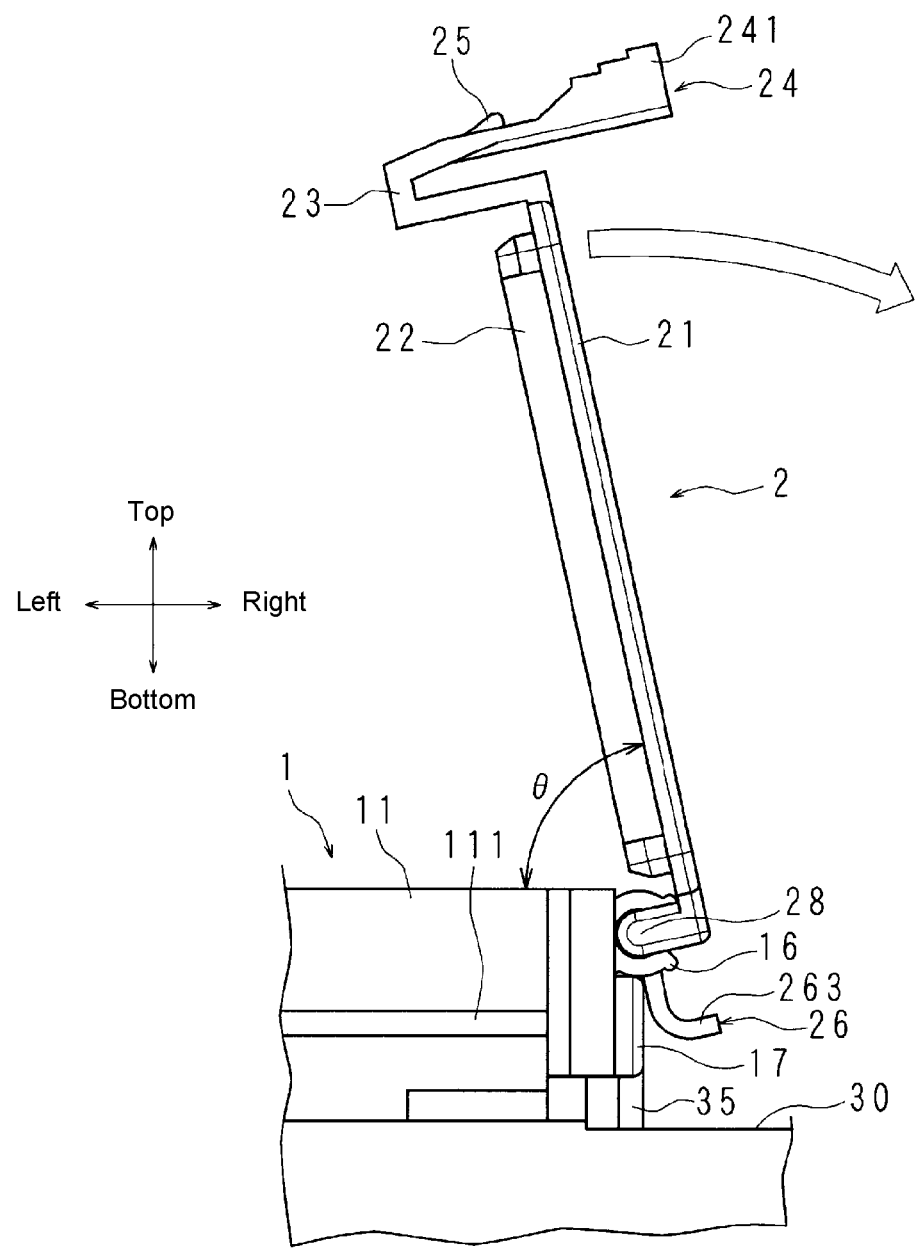
FIG. 9 is a side view of the electrical junction box as seen from the direction of the black arrow in FIG. 8.

FIG. 8 is a perspective view illustrating a case in which the lid 2 is in the open state in the electrical junction box 100 according to Embodiment 1, and FIG. 9 is a side view of the electrical junction box 100 according to Embodiment 1. FIG. 9 is a side view of the electrical junction box 100 as seen from the direction of the black arrow in FIG. 8.

When the lid 2 is in the closed state, the locking claw 25 is locked to the locking recess portion 142 by a counterforce of the fitting spring 24 (fitting portion 23) in the direction opposite to the bend direction as mentioned above (see FIG. 5). The locking of the locking claw 25 and the locking recess portion 142 to one another can be released and the lid 2 can be placed in the open state by a worker pulling the grip 241 of the fitting spring 24 in the bend direction of the fitting portion 23. The lid 2 can freely rotate following this point.

In the electrical junction box 100 according to Embodiment 1, the spring 263 of the spring portion 26 collides with the engagement receiving portion 35 when the lid 2 in the open state rotates in the direction in which an opening angle θ (see the direction of the arrow in FIG. 9) increases and the opening angle θ reaches a predetermined angle. Here, the opening angle θ is the angle between the one end of the square cylinder portion 11 and the stopper plate 21 (see FIG. 9).

Specifically, the spring 263 collides with the engagement receiving portion 35 before the opening angle θ reaches 90 degrees, and the lid 2 cannot rotate any further. In other words, the spring portion 26 restricts the lid 2 from rotating to 90 degrees or more, or that is, the spring portion 26 restricts the lid 2 from rotating such that the opening angle θ will not reach 90 degrees. When the lid 2 rotates to 90 degrees or more, resilience to return to its original shape acts on the spring 263 because the spring portion 26 (spring 263) is bent. That is, when the lid 2 rotates to 90 degrees or more, the spring portion 26 biases the lid 2 in the direction in which the lid 2 closes.

As described above, in the electrical junction box 100 according to Embodiment 1, the cover 10 is rotatably provided, and opens and closes the portion where the terminal 70 and the busbar 40 are connected. Furthermore, the cover 10 is maintained in the open state by the open-state maintaining portion 332 engaging with the recess portion 141 and the rotation of the cover 10 being thereby restricted when the cover 10 is in the open state. Furthermore, the engagement between the open-state maintaining portion 332 and the recess portion 141 is released by a worker mounting the busbar 40 on the terminal 70 in order to carry out assembly work of screwing the busbar 40 to the housing 50.

In other words, the cover 10 is maintained in the open state until a worker mounts the busbar 40 on the terminal 70. Accordingly, the cover 10 is maintained in the open state while the electrical junction box 100, in a state in which the busbar 40 is not connected to the terminal 70, is transported to the assembly work process. Thus, an operation in which the worker carrying out the assembly work opens the cover 10 prior to the assembly work can be eliminated. Consequently, the producibility of the electrical junction box 100 can be enhanced.

Note that, because the engagement between the open-state maintaining portion 332 and the recess portion 141 is released by the busbar 40 being mounted on the terminal 70 during the assembly work, the worker only needs to place the cover 10 in the closed state by rotating the cover 10 and fitting the engaging claw 15 into the engagement receiving portion 35 after the assembly work.

Furthermore, in the electrical junction box 100 according to Embodiment 1, the spring portion 26 restricts the lid 2 from rotating to 90 degrees or more as mentioned above. When the lid 2 rotates to 90 degrees or more, the spring portion 26 biases the lid 2 in the direction in which the lid 2 closes.

That is, in the electrical junction box 100 according to Embodiment 1, the lid 2 closes due to the weight of the lid 2 itself when a worker lets go of the lid 2 after rotating the lid 2 to less than 90 degrees. On the other hand, the lid 2 is closed by the spring portion 26 when the worker lets go of the lid 2 after rotating the lid 2 to 90 degrees or more. In other words, regardless of the angle to which the worker has rotated the lid 2, the lid 2 is closed when the worker lets go of the lid 2.

For example, a worker inspecting the state of the connection between the terminal 70 and the busbar 40, etc., opens the lid 2 to carry out the inspection work, and then places the lid 2 in the closed state by closing the lid 2 and pushing the fitting spring 24 into the space 18 as mentioned above. However, if the worker forgets to close the lid 2, problems such as electric shock, electric leakage, and short-circuiting may occur because the terminal 70 and the busbar 40 would remain exposed to the outside.

In contrast, in the electrical junction box 100 according to Embodiment 1, the above-mentioned problems can be prevented because the lid 2 is closed when a worker lets go of the lid 2, even if the worker forgets to close the lid 2.

Embodiment 2

Figure 10:
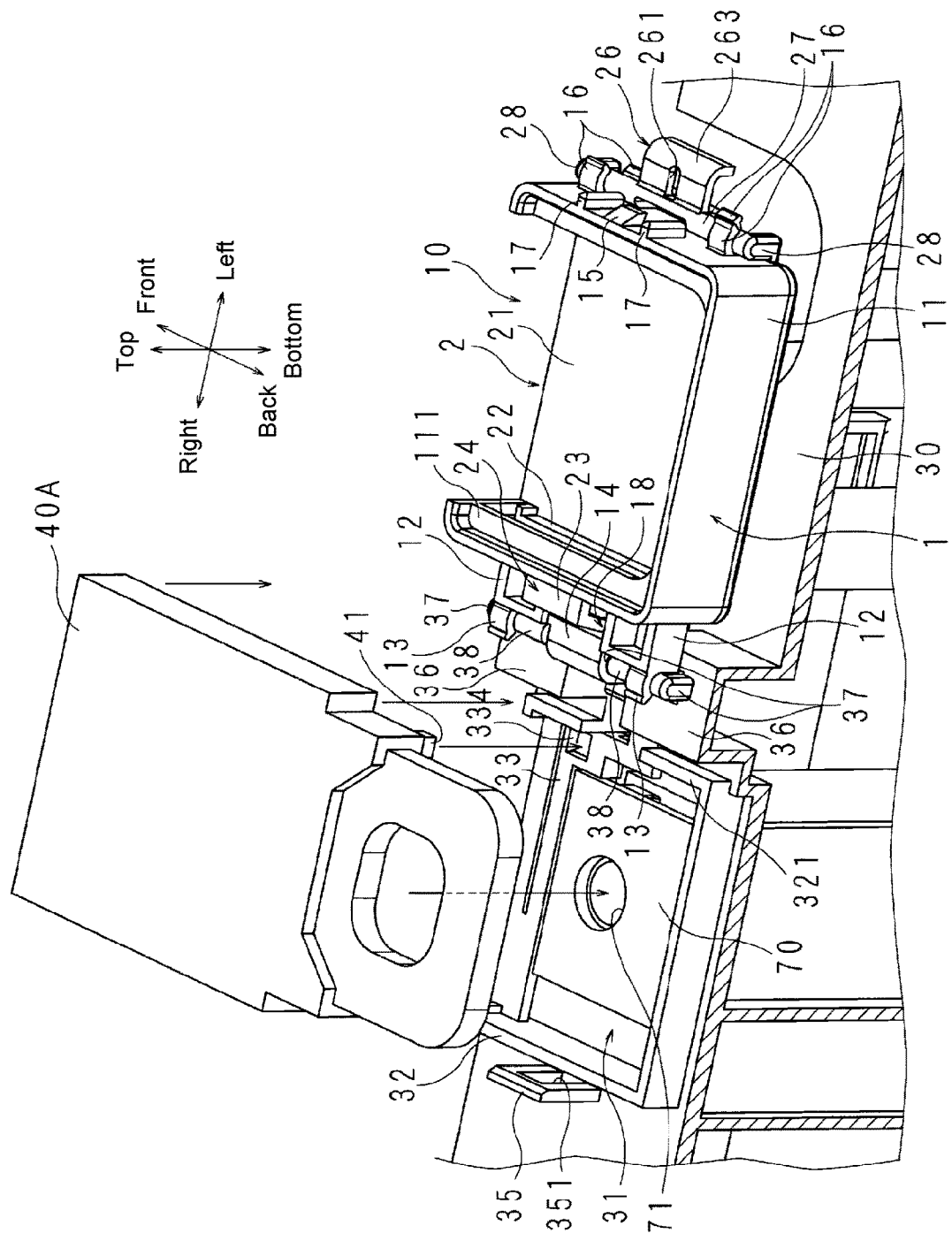
FIG. 10 is a perspective view illustrating a state of the electrical junction box according to Embodiment 2 in which a cover is completely open.

FIG. 10 is a perspective view illustrating a state of an electrical junction box 100 according to Embodiment 2 in which the cover 10 is completely open. In FIG. 10, a case in which a busbar 40A is connected to the terminal 70 is illustrated as an example, and, for the sake of convenience, a state in which the busbar 40A is separated from the terminal 70 is illustrated.

Similarly to Embodiment 1, in the electrical junction box 100 according to Embodiment 2, the terminal 70 is exposed through the through-hole 31 in the ceiling plate 30, and the cover 10 covering the terminal 70 is provided. The cover 10 is rotatably provided, and includes the circumferential wall portion 1 and the lid 2. The lid 2 is rotatably provided, and opens and closes the opening in the one end of the circumferential wall portion 1.

In the electrical junction box 100 according to Embodiment 2, a contacting projection 41 that has a rectangular cross-sectional shape and contacts a swinging piece 33 is provided so as to project from an edge portion of the one surface of the busbar 40A. That is, when the busbar 40A is mounted on the terminal 70, the contacting projection 41 on the busbar 40A contacts the swinging piece 33.

Furthermore, in the electrical junction box 100 according to Embodiment 2, a depression 334 is provided in the form of a recess at a position of the swinging piece 33 corresponding to the contacting projection 41 on the busbar 40A when the busbar 40A is mounted on the terminal 70. In a plan view, the depression 334 is a rectangle larger than the contacting projection 41.

Similarly to Embodiment 1, in the electrical junction box 100 according to Embodiment 2, the cover 10 is maintained in the open state by the open-state maintaining portion 332 engaging with the recess portion 141 until a worker mounts the busbar 40A on the terminal 70 in order to carry out assembly work of screwing the busbar 40A to the housing 50. Accordingly, the cover 10 is maintained in the open state while the electrical junction box 100, in a state in which the busbar 40A is not connected to the terminal 70, is transported to the assembly work process. Thus, an operation in which the worker carrying out the assembly work opens the cover 10 prior to the assembly work can be eliminated, and the producibility of the electrical junction box 100 can be improved.

On the other hand, when the busbar 40A is mounted on the terminal 70 during the assembly work, the contacting projection 41 on the busbar 40A is inserted into the depression 334 in the swinging piece 33, and the swinging piece 33 is pushed by the busbar 40A. Then, the swinging piece 33 moves downward, or that is, moves down to the inside of the housing 50. Because the open-state maintaining portion 332 of the swinging piece 33 also moves downward at this time, the engagement between the open-state maintaining portion 332 and the recess portion 141 is released. Accordingly, the worker can place the cover 10 in the closed state by rotating the cover 10 after the assembly work.

Also, the busbar 40A is guided and positioned in an appropriate position because the contacting projection 41 on the busbar 40A is inserted into the depression 334 in the swinging piece 33 when the busbar 40A is mounted on the terminal 70.

Furthermore, in the electrical junction box 100 according to Embodiment 2, regardless of the angle to which the worker has rotated the lid 2, the lid 2 is closed when the worker lets go of the lid 2, similarly to Embodiment 1.

Accordingly, in the electrical junction box 100 according to Embodiment 2, problems such as electric shock, electric leakage, and short-circuiting can be prevented from occurring because the lid 2 is closed when a worker lets go of the lid 2 even if the worker forgets to close the lid 2 after opening the lid 2, and thus the terminal 70 and the busbar 40A do not remain exposed to the outside.

The same reference symbols are given to portions similar to those in Embodiment 1 and detailed description is omitted.

Embodiment 3

Figure 11:
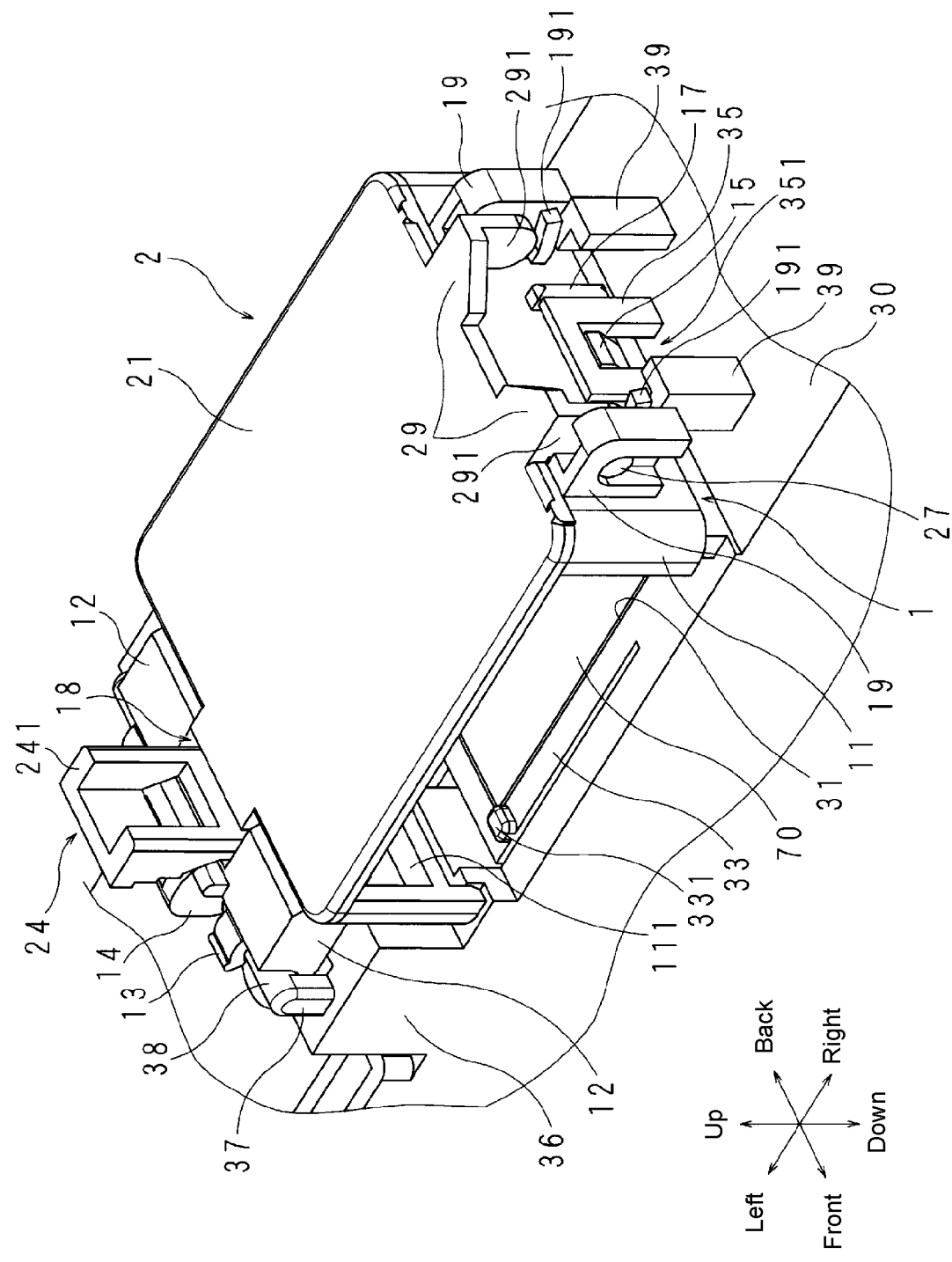
FIG. 11 is a perspective view illustrating a state of the electrical junction box according to Embodiment 3 in which the cover is closed.
Figure 12:
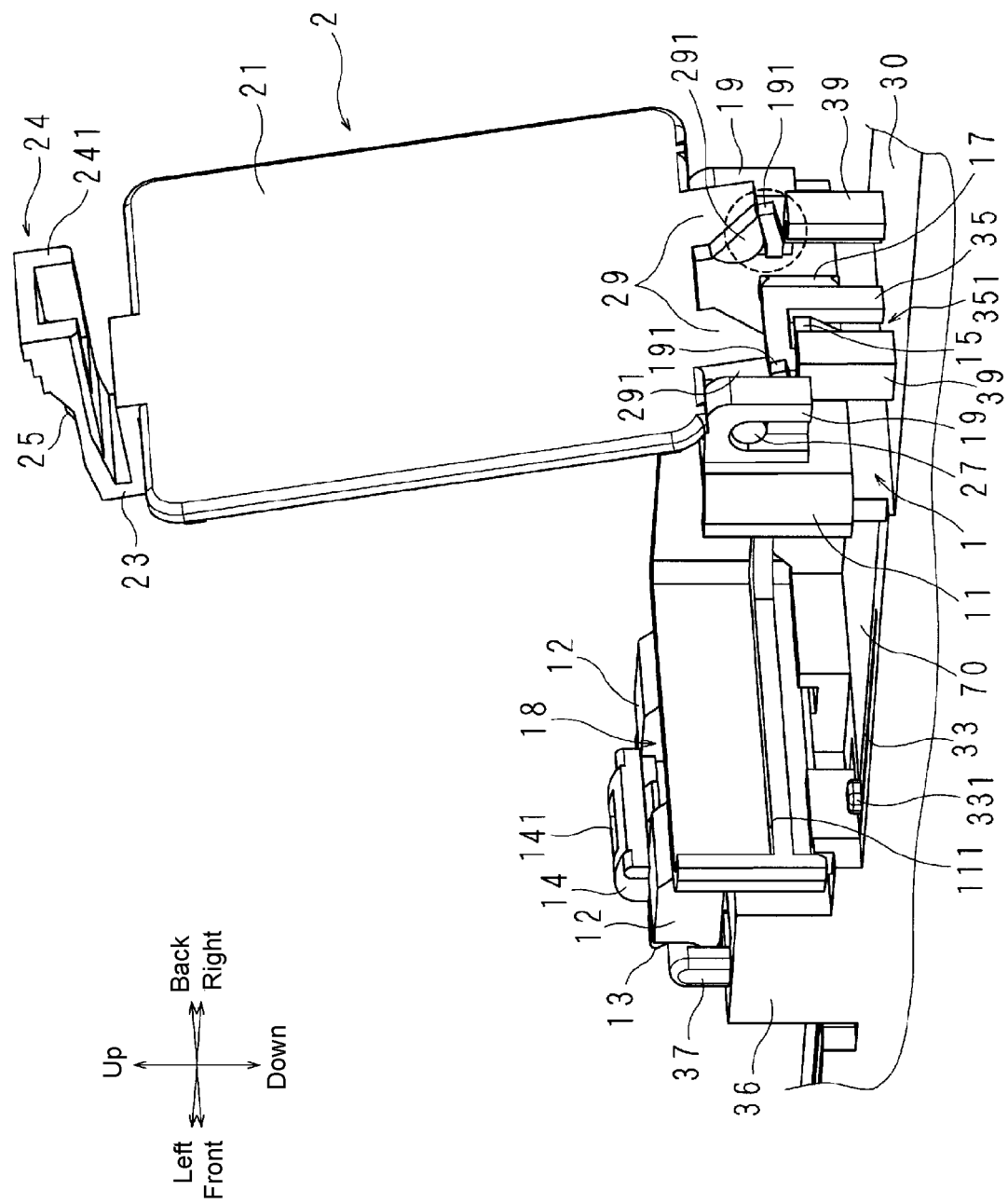
FIG. 12 is a perspective view illustrating a case in which a lid is in an open state in the electrical junction box according to Embodiment 3.

FIG. 11 is a perspective view illustrating a case in which the cover 10 is closed in an electrical junction box 100 according to Embodiment 3, and FIG. 12 is a perspective view illustrating a case in which the lid 2 is in the open state in the electrical junction box 100 according to Embodiment 3. In FIGS. 11 and 12, illustration of the busbar 40 is omitted for the sake of convenience.

Similarly to Embodiment 1, in the electrical junction box 100 according to Embodiment 3, a terminal 70 is exposed through the through-hole 31 in the ceiling plate 30, and the cover 10 covering the terminal 70 is provided. The cover 10 is rotatably provided, and includes the circumferential wall portion 1 and the lid 2. The lid 2 is rotatably provided, and opens and closes the opening in the one end of the circumferential wall portion 1.

In the electrical junction box 100 according to Embodiment 3, two holding portions 29 that hold the second rotation shafts 27 are provided to as to be connected to the one edge of the stopper plate 21. The two holding portions 29 are provided between the center and the two ends of the one edge of the stopper plate 21. Each holding portion 29 includes a base portion that substantially has the shape of a right-angled triangle and that is provided so as to extend from the one edge along the stopper plate 21. The two holding portions 29 are provided so that the oblique sides of the base portions thereof face one another.

A holding bracket 291 that holds a second rotation shaft 27 is provided so as to be connected to the outer edge of the base portion of each holding portion 29. The holding bracket 291 has the shape of a substantially rectangular plate, and extends downward from the base portion. The two corners of the short side in the bottom end portion of the holding bracket 291 is chamfered and rounded.

The holding brackets 291 face one another, and a second rotation shaft 27 having the shape of a round bar is attached to the outer surface of each holding bracket 291. The second rotation shafts 27 are rotatably supported by later-described shaft supporting portions 19.

For example, the stopper plate 21, the holding portions 29, and the second rotation shafts 27 are integrally formed.

Two shaft supporting portions 19 that support the second rotation shafts 27 are provided on the other side wall of the square cylinder portion 11, which opposes the one side wall. The shaft supporting portions 19 are substantially rectangular-parallelepiped-shaped, and are provided on the other side wall of the square cylinder portion 11. A shaft supporting portion 19 is provided on each of the two front-back-direction end portions of the other side wall of the square cylinder portion 11. Each shaft supporting portion 19 is provided so as to extend from the one end to the middle portion of the other side wall of the square cylinder portion 11, and the shaft supporting portions 19 face one another in the front-back direction.

Each shaft supporting portion 19 has a cutout formed in each of an inner surface and an outer surface on the opposite side from the inner surface. The cutout formed in the inner surface of the shaft supporting portion 19 (hereinafter "inner cutout") is formed so as to extend from the top end to the middle portion of the inner surface, and the cutout formed in the outer surface of the shaft supporting portion 19 (hereinafter "outer cutout") is formed so as to extend from the bottom end to the middle portion of the outer surface.

A circular through-hole (unillustrated) that passes through the bottom of the inner cutout and the bottom of the outer cutout is formed in each shaft supporting portion 19. The second rotation shafts 27 are inserted into the through-holes from the inner cutout-side of the shaft supporting portions 19, and protrude from the outer cutouts. That is, each second rotation shaft 27 is rotatably fitted into the through-hole in the corresponding shaft supporting portion 19.

Furthermore, a spring rib 191 (spring portion) that guides the rotation of a holding bracket 291 is provided below the inner cutout on the inner surface of each shaft supporting portion 19. The spring rib 191 extends in the width direction (left-right direction) of the shaft supporting portion 19. The spring rib 191 is formed so as to gradually rise as the distance from the other side wall of the square cylinder portion 11 increases, or that is, so as to approach the holding bracket 291. Only one end portion of the spring rib 191 on the side of the other side wall of the square cylinder portion 11 is fixed to the shaft supporting portion 19, and the remaining portion of the spring rib 191 is free. Accordingly, the remaining portion of the spring rib 191 can swing in the top-bottom direction, or that is, in the direction in which the remaining portion moves toward and away from the holding bracket 291.

Below the spring rib 191 of each shaft supporting portion 19, a swing-restricting member 39 that restricts the swinging of the spring rib 191 is provided so as to project from the top surface of the ceiling plate 30. The swing-restricting member 39 is L-shaped in a plan view. The distal-end surface of the swing-restricting member 39 is a horizontal surface. When the spring rib 191 swings any lower than the horizontal position, the bottom surface of the spring rib 191 comes into contact with the distal-end surface of the swing-restricting member 39. Accordingly, the spring rib 191 is restricted from moving down any lower than the horizontal position.

In the electrical junction box 100 according to Embodiment 3 having such a configuration, the side surfaces of the outer long-side portions of the holding brackets 291 collide with the top surfaces of the spring ribs 191 if the lid 2 in the open state rotates in the direction in which an opening angle θ (see the direction of the arrow in FIG. 9) increases and the opening angle θ reaches a predetermined angle. Here, the opening angle θ is the angle between the one end of the square cylinder portion 11 and the stopper plate 21.

Specifically, the side surfaces of the holding brackets 291 collide with the spring ribs 191 before the opening angle θ reaches 90 degrees, and the lid 2 is inhibited from rotating any further (see the dashed-circle portion in FIG. 12). In other words, the spring ribs 191 restrict the lid 2 from rotating to 90 degrees or more, or that is, the spring ribs 191 restrict the lid 2 from rotating such that the opening angle θ will not reach 90 degrees.

If a worker rotates the lid 2 any further, resilience acts on the spring ribs 191 because the distal-end portions thereof bend downward, and the spring ribs 191 bias the lid 2 in the direction in which the lid 2 closes. If the worker lets go of the lid 2 at this time, the lid 2 is closed by the resilience of the spring ribs 191.

On the other hand, if the worker does not stop here and tries to rotate the lid 2 further, the bottom surfaces of the spring ribs 191 come into contact with the distal-end surfaces of the swing-restricting members 39 as mentioned above. Accordingly, the spring ribs 191 are restricted from moving down any lower than the horizontal position, and it becomes impossible to rotate the lid 2 any further.

Thus, also in the electrical junction box 100 according to Embodiment 3, regardless of the rotation angle of the lid 2, the lid 2 is closed when a worker lets go of the lid 2 even if the worker forgets to close the lid 2 after opening the lid 2, similarly to Embodiment 1. Accordingly, the terminal 70 and the busbar 40 do not remain exposed to the outside, and problems such as electric shock, electric leakage, and short-circuiting can be prevented from occurring.

The same reference symbols are given to portions similar to those in Embodiment 1 and detailed description is omitted.

The embodiments disclosed herein are examples in every way, and shall be construed as being non-limiting. The scope of the present disclosure is not limited to what is defined above, and is intended to include all modifications that are indicated by the claims and are within the meaning and scope of equivalents of the claims.

The invention claimed is:

1. An electrical junction box for vehicles, the electrical junction box comprising:
   a busbar one surface of which is placed into contact with a terminal exposed from a through-hole in a housing;
   a cover that covers the terminal and the busbar from the other surface-side of the busbar, wherein the cover is rotatably provided on one wall of the housing;
   a swinging piece including a projection that comes into contact with the busbar, the swinging piece configured to swing in a thickness direction of the one wall; and
   an open-state maintaining portion configured to maintain the cover in an open state, the open-state maintaining portion disposed in an end portion of the swinging piece.

2. The electrical junction box according to claim 1 further including an engagement portion that is provided in the cover and that includes a recess portion that engages with the open-state maintaining portion when the cover is in the open state.

3. The electrical junction box according to claim 2, wherein the cover includes:

a circumferential wall portion that has a shape of a square cylinder one wall of which is open; and a lid configured to open and close an opening in one end of the circumferential wall portion.

4. The electrical junction box according to claim 1, wherein the cover includes:

a circumferential wall portion that has a shape of a square cylinder one wall of which is open; and a lid configured to open and close an opening in one end of the circumferential wall portion.

5. The electrical junction box according to claim 4, wherein the lid:

is rotatably held; and includes a spring portion configured to restrict the lid from rotating to a predetermined angle or more.

6. An electrical junction box for vehicles, the electrical junction box comprising:

a busbar one surface of which is placed into contact with a terminal exposed from a through-hole in a housing;

a cover that covers the terminal and the busbar from the other surface-side of the busbar, wherein the cover is rotatably provided on one wall of the housing;

an open-state maintaining portion configured to maintain the cover in an open state;

a swinging piece configured to swing in a thickness direction of the one wall;

a projection that comes into contact with the swinging piece is provided on the busbar.

7. The electrical junction box according to claim 6, wherein a depression is formed in the swinging piece at a position corresponding to the projection on the busbar.

* * * * *